(12) United States Patent
Konno et al.

(10) Patent No.: US 8,120,050 B2
(45) Date of Patent: Feb. 21, 2012

(54) LIGHT-EMITTING ELEMENT

(75) Inventors: Taichiroo Konno, Hitachi (JP);
Takehiko Tani, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 167 days.

(21) Appl. No.: 12/585,494

(22) Filed: Sep. 16, 2009

(65) Prior Publication Data

US 2010/0252849 A1    Oct. 7, 2010

(30) Foreign Application Priority Data

Apr. 7, 2009    (JP) .................. 2009-092681

(51) Int. Cl.
*H01L 33/00*    (2010.01)

(52) U.S. Cl. .......... 257/98; 257/213; 257/256; 257/257; 257/E33.005; 257/E33.068

(58) Field of Classification Search .............. 257/98, 257/E33.068, E33.005, 213, 256, 257
See application file for complete search history.

(56) References Cited

U.S. PATENT DOCUMENTS

| 7,449,722 B2 | 11/2008 | Konno et al. |
| 2006/0192211 A1* | 8/2006 | Kako et al. ............ 257/79 |
| 2007/0023768 A1 | 2/2007 | Konno et al. |
| 2008/0093612 A1* | 4/2008 | Konno et al. ............ 257/96 |

FOREIGN PATENT DOCUMENTS

JP    2007-42751    2/2007

* cited by examiner

*Primary Examiner* — Lynne Gurley
*Assistant Examiner* — Vernon P Webb
(74) *Attorney, Agent, or Firm* — McGinn IP Law Group, PLLC

(57) ABSTRACT

A light-emitting element includes a semiconductor substrate, a light emitting layer portion including an active layer on the semiconductor substrate, a first reflective layer between the semiconductor substrate and the active layer for reflecting light emitted from the active layer; and a second reflective layer between the semiconductor substrate and the first reflective layer for reflecting light with a wavelength different from that of the light reflected by the first reflective layer. The second reflective layer reflects light with a wavelength longer than that of the light reflected by the first reflective layer.

19 Claims, 4 Drawing Sheets

1 LIGHT-EMITTING ELEMENT
100 FRONT SURFACE ELECTRODE
240 INTERMEDIATE LAYER
220 ACTIVE LAYER
260 FIRST REFLECTIVE LAYER
262 SECOND REFLECTIVE LAYER
10 SEMICONDUCTOR SUBSTRATE
110 BACK SURFACE ELECTRODE

20 SEMICONDUCTOR LAMINATED STRUCTURE
200 BUFFER LAYER
210 n-TYPE CLADDING LAYER
230 p-TYPE CLADDING LAYER
250 CURRENT DISPERSION LAYER

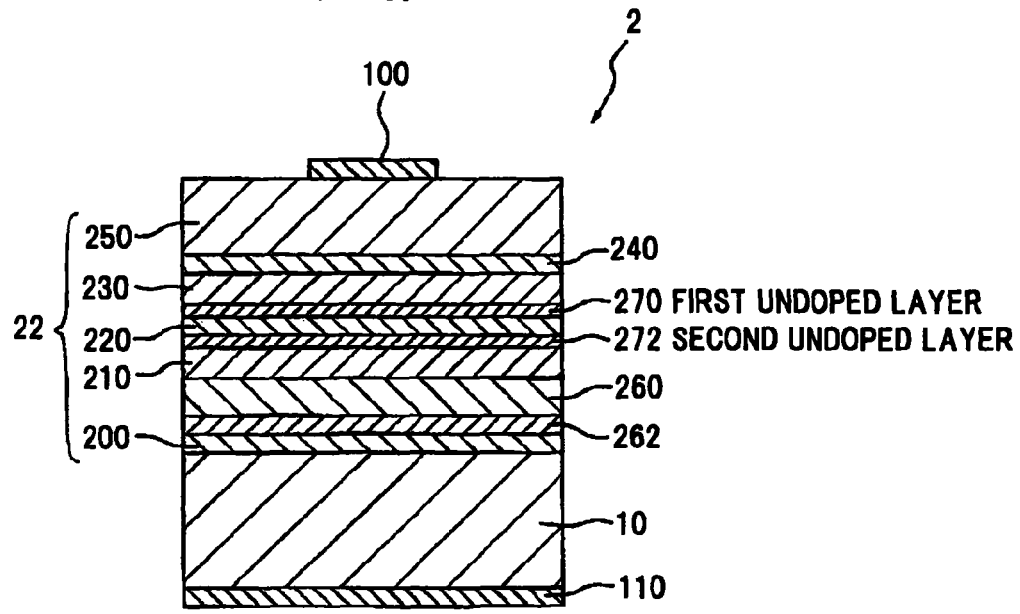
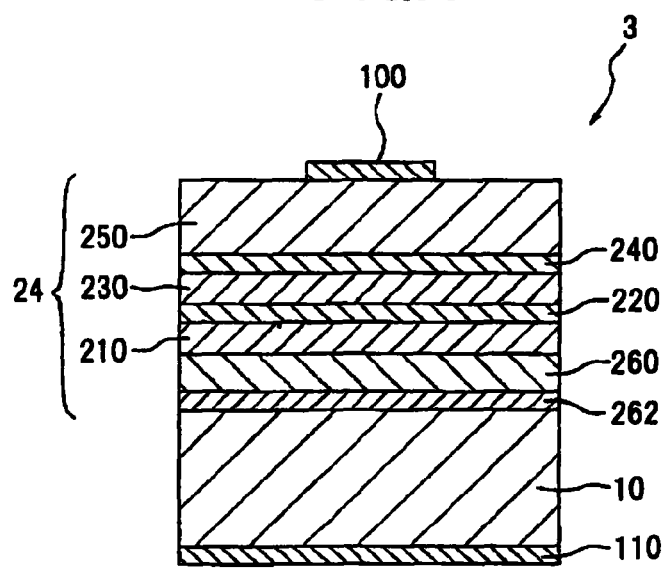

LIGHT-EMITTING ELEMENT

The present application is based on Japanese Patent Application No. 2009-092681 filed on Apr. 7, 2009, the entire contents of which are incorporated herein by reference.

BACKGROUND OF THE INVENTION

1. Field of the Invention

The invention relates to a light-emitting element and, in more particular, to a high-intensity light-emitting element.

2. Related Art

A conventional light-emitting element is known in which an n-type GaAs buffer layer, an n-type light reflection layer portion composed of a combination of a $(Al_XGa_{1-X})_YIn_{1-Y}P$ layer ($0 \leq X \leq 1$, $0.4 \leq Y \leq 0.6$) and a $Al_XGa_{1-X}As$ layer ($0 \leq X \leq 1$), an n-type AlGaInP cladding layer, an undoped AlGaInP active layer, a p-type AlGaInP cladding layer, a p-type GaInP intermediate layer and a p-type GaP current dispersion layer are formed on an n-type GaAs substrate in this order, and the p-type AlGaInP layer has a dopant suppression layer at a portion not in contact with an undoped AlGaInP layer and the p-type GaInP intermediate layer (e.g., see JP-A 2007-42751).

In the light-emitting element described in JP-A 2007-42751, it is possible to improve reliability of relative output and reverse voltage by including the above-mentioned configuration while realizing high intensity.

However, in the light-emitting element described in JP-A2007-42751, when light emitted from the undoped AlGaInP active layer reaches the GaAs substrate, the GaAs substrate is excited by the light and the light equivalent to a bandgap of the GaAs may be radiated from the GaAs substrate to outside of the light-emitting element.

SUMMARY OF THE INVENTION

Therefore, it is an object of the invention to provide a light-emitting element which can suppress radiation of the light with an unnecessary wavelength.

(1) According to one embodiment, a light-emitting element comprises:

a semiconductor substrate;

a light emitting layer portion comprising an active layer on the semiconductor substrate;

a first reflective layer between the semiconductor substrate and the active layer for reflecting light emitted from the active layer; and a second reflective layer between the semiconductor substrate and the first reflective layer for reflecting light with a wavelength different from that of the light reflected by the first reflective layer.

In the above embodiment (1), the following modifications and changes can be made.

(i) The second reflective layer reflects light with a wavelength longer than that of the light reflected by the first reflective layer.

(ii) The light emitting layer portion comprises a first cladding layer of a first conductivity type, a second cladding layer of a second conductivity type different from the first conductivity type, and the active layer between the first and second cladding layers, and the light-emitting element further comprises a current dispersion layer of the second conductivity type on the second cladding layer opposite the active layer via an intermediate layer, wherein the intermediate layer is formed of a semiconductor comprising a bandgap energy between that of the second cladding layer and that of the current dispersion layer.

(iii) The first reflective layer comprises a first pair layer comprising two first semiconductor layers having refractive indexes different from each other, and the two first semiconductor layers comprise a bandgap energy greater than energy of light emitted from the active layer, and the second reflective layer comprises a second pair layer comprising two second semiconductor layers having refractive indexes different from each other, and the two second semiconductor layers comprise a bandgap energy equivalent to or smaller than the energy of light emitted from the active layer.

(iv) The two first semiconductor layers composing the first reflective layer and the two second semiconductor layers composing the second reflective layer each have a bandgap energy greater than that of the semiconductor substrate.

(v) The two first semiconductor layers composing the first reflective layer each have a thickness $d_1$ to satisfy $d_1 = \lambda_{P1}/(4 \times n_1) \times X$ ($0.7 \leq X \leq 1.3$) where a peak wavelength of light emitted from the active layer is $\lambda_{P1}$ and a refractive index of the two first semiconductor layers is $n_1$.

(vi) The two second semiconductor layers composing the second reflective layer each have a thickness $d_2$ to satisfy $d_2 = \lambda_{P2}/(4 \times n_2) \times X$ ($0.7 \leq X \leq 1.3$) where a wavelength $\lambda_{P2}$ is in a range of not less than 850 nm and not more than 900 nm and a refractive index of the two second semiconductor layers is $n_2$.

(vii) The first reflective layer comprises not less than 10 pairs and not more than 20 pairs of the first pair layers, and the second reflective layer comprises not less than 2 pairs and not more than 5 pairs of the second pair layers.

(viii) When light emitted from the active layer is inputted to the semiconductor substrate, the semiconductor substrate emits light with a wavelength longer than that of the inputted light.

(ix) The light-emitting element further comprises:

a buffer layer between the semiconductor substrate and the second reflective layer, wherein the buffer layer has a carrier concentration lower than that of the semiconductor substrate.

(x) The active layer comprises a multiple quantum well structure, and the light-emitting element further comprises:

a first insertion layer between the active layer and the first cladding layer, the first insertion layer having a carrier concentration lower than that of the first cladding layer; and a second insertion layer between the active layer and the second cladding layer, the second insertion layer having a carrier concentration lower than that of the second cladding layer.

Points of the Invention

According to one embodiment of the invention, a light-emitting element comprises a second reflective layer between a semiconductor substrate and a first reflective layer for reflecting light radiated from the semiconductor substrate back to the semiconductor substrate side as well as the first reflective layer for reflecting light emitted from an active layer. Therefore, it is possible to effectively extract light emitted from the active layer outside the light-emitting element and to reflect light with a wavelength longer than that of light (i.e., light with an unnecessary wavelength) emitted from the active layer to the semiconductor substrate side. Thus, the light-emitting element can suppress malfunction of optical sensors such as a photodiode as well as serving as a high-intensity light-emitting element for a scanner.

BRIEF DESCRIPTION OF THE DRAWINGS

Next, the present invention will be explained in more detail in conjunction with appended drawings, wherein:

FIG. 3 is a schematic longitudinal section showing a light-emitting element in a second embodiment of the invention;

FIG. 4 is a schematic longitudinal section showing a light-emitting element in a third embodiment of the invention;

DESCRIPTION OF THE PREFERRED EMBODIMENTS

First Embodiment

Figure 1:
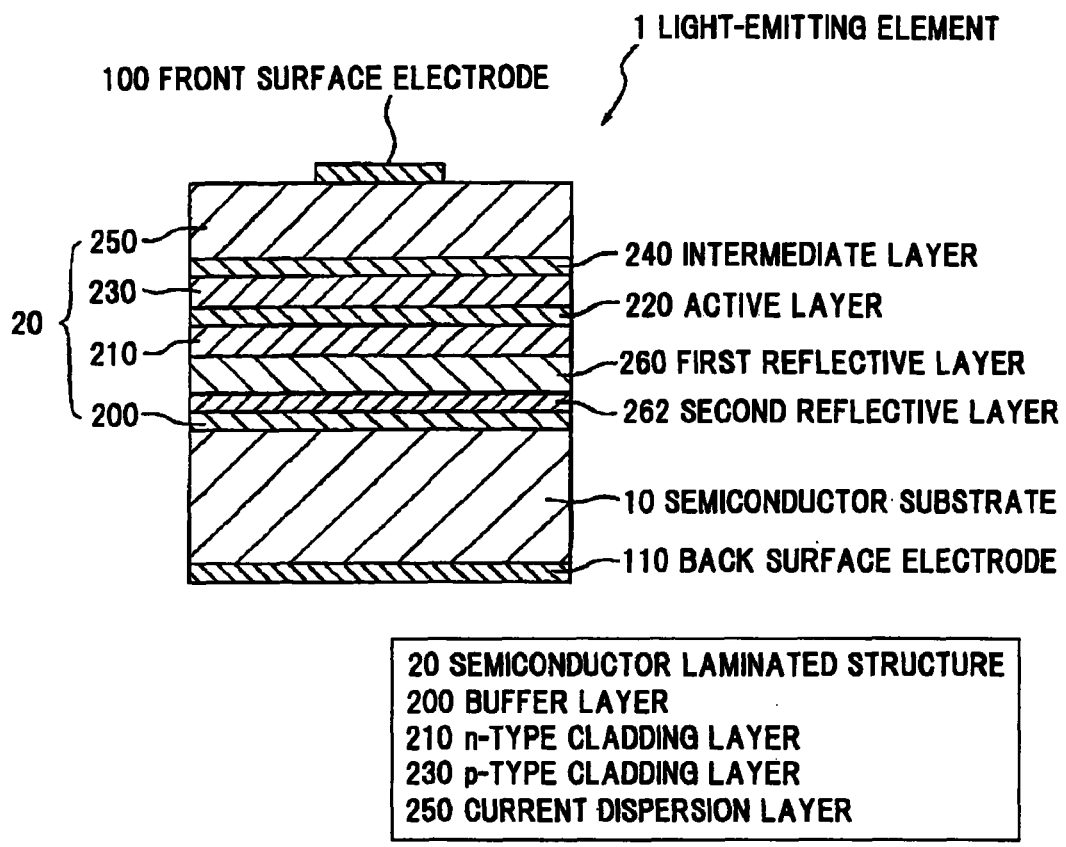
FIG. 1 is a schematic longitudinal section showing a light-emitting element in a first preferred embodiment of the invention.

FIG. 1 is a schematic longitudinal section showing a light-emitting element in a first preferred embodiment of the invention.

Structural Overview of Light-Emitting Element 1

A light-emitting element 1 in the first embodiment is provided with a semiconductor substrate 10 of n-type as a first conductivity type, a semiconductor laminated structure 20 provided on the semiconductor substrate 10 and including an active layer 220 which emits light with a predetermined wavelength, a front surface electrode 100 as a wire bonding pad provided on a portion of a surface of the semiconductor laminated structure 20 opposite to the semiconductor substrate 10, and a back surface electrode 110 provided in ohmic contact with a surface of the semiconductor substrate 10 opposite to the semiconductor laminated structure 20 (i.e., a back surface of the semiconductor substrate 10).

In addition, the semiconductor laminated structure 20 has an n-type buffer layer 200 provided in contact with the surface of the semiconductor substrate 10, an n-type cladding layer 210 provided above the buffer layer 200, an active layer 220 provided on the n-type cladding layer 210, a p-type cladding layer 230 as a second conductivity type provided on the active layer 220, an intermediate layer 240 provided on the p-type cladding layer 230, and a p-type current dispersion layer 250 provided on the intermediate layer 240. A laminated portion composed of the n-type cladding layer 210, the active layer 220 and the p-type cladding layer 230 is called a light emitting layer portion in the present embodiment. The front surface electrode 100 is provided in ohmic contact with a portion of a surface of the current dispersion layer 250 opposite to the intermediate layer 240.

Furthermore, the semiconductor laminated structure 20 in the first embodiment has a first reflective layer 260 provided between the semiconductor substrate 10 and the active layer 220 for reflecting light emitted from the active layer 220, and a second reflective layer 262 provided between the first reflective layer 260 and the semiconductor substrate 10 for reflecting light with a wavelength different from that of the light reflected by the first reflective layer 260. In the first embodiment, the second reflective layer 262 reflects light with a wavelength longer than that of the light reflected by the first reflective layer 260.

Semiconductor Substrate 10

The semiconductor substrate 10 is formed of a compound semiconductor which emits light with a wavelength longer than that of the light emitted from the active layer 220 when the light is incident. In detail, the semiconductor substrate 10 is formed of a compound semiconductor having a bandgap energy smaller than energy of the light emitted from the active layer 220. For example, when the wavelength of the emitted from the active layer 220 is a wavelength in a red region (i.e., about from 600 to 700 nm), the semiconductor substrate 10 is formed of GaAs having a predetermined carrier concentration. In this case, when the infrared light is incident, the semiconductor substrate 10 is excited and radiates the infrared light outside.

Buffer Layer 200, n-Type Cladding Layer 210, Active Layer 220 and p-Type Cladding Layer 230

The buffer layer 200 is provided in contact with the semiconductor substrate 10. When the semiconductor substrate 10 is formed of, e.g., an n-type GaAs substrate, the buffer layer 200 is formed of n-type GaAs. In addition, the n-type cladding layer 210, the active layer 220 and the p-type cladding layer 230 are each formed of a ternary or quaternary group III compound semiconductor material represented by $(Al_X Ga_{1-X})_Y In_{1-Y} P$ ($0 \leq X \leq 1$, $0 \leq Y \leq 1$). The active layer 220 in the first embodiment can be formed of, e.g., a non-dope $Ga_X In_{1-X} P$ single layer ($0 \leq X \leq 1$).

Intermediate Layer 240

When a semiconductor material composing the p-type cladding layer 230 and that composing the current dispersion layer 250 are different each other, the intermediate layer 240 is formed of a semiconductor material which reduces a potential barrier at a hetero-interface between the p-type cladding layer 230 and the current dispersion layer 250. In detail, the intermediate layer 240 is provided on the p-type cladding layer 230 opposite to the active layer 220, and is formed of a semiconductor material having a bandgap energy between bandgap energies of a semiconductor composing the p-type cladding layer 230 and a semiconductor composing the current dispersion layer 250. The intermediate layer 240 is formed of, e.g., p-type $Ga_X In_{1-X} P$. It is possible to reduce forward voltage of the light-emitting element 1 by providing the intermediate layer 240 thereto.

Current Dispersion Layer 250

The current dispersion layer 250 disperses a current supplied to the light-emitting element 1 so that the current is substantially uniformly supplied to the active layer 220. In addition, the current dispersion layer 250 is formed of a semiconductor material transmitting the light emitted from the active layer 220. The current dispersion layer 250 can be formed of, e.g., p-type $Ga_X In_{1-X} P$ ($0.8 \leq X \leq 1$), and as an example, the current dispersion layer 250 is formed of p-type GaP.

First Reflective Layer 260

The first reflective layer 260 is formed by laminating plural first semiconductor layers transparent to the light emitted from the active layer 220 in order to suppress absorption of the light emitted from the active layer 220 by the first reflective layer 260 and to improve a light reflection effect of the first reflective layer 260 itself. In detail, the first reflective layer 260 is formed of plural first pair layers composed of one first semiconductor layer and another first semiconductor layer formed of a semiconductor material having refractive indexes different from that of a semiconductor material composing the one first semiconductor layer. In the present embodiment, the number of first pair layers in the first reflective layer 260 is preferably less than 20 pairs. Furthermore, the number of first pair layers is 5 pairs or more, preferably 10 pairs or more. In addition, the first pair layer composing the first reflective layer 260 is formed of a semiconductor material having a bandgap energy larger than that of a semiconductor material composing the semiconductor substrate 10.

Here, when a peak wavelength of the light emitted from the active layer 220 is defined as $\lambda_{P1}$ and refractive index of the one first semiconductor layer is defined as $n_1$, the one first semiconductor layer has a thickness $d_1$ which satisfies a relationship of Thickness $d_1 = \lambda_{P1}/(4 \times n_1) \times x$ ($0.7 \leq x \leq 1.3$). In addition, the other first semiconductor layer has a thickness satisfying the same relationship for the thickness of the one first semiconductor layer. The thickness $d_1$ of the first semiconductor layer is, e.g., not less than 35 nm nor more than 65 nm, preferably, not less than 45 nm nor more than 55 nm. The one and other first semiconductor layers composing the first reflective layer 260 are each formed of a semiconductor material transparent to the light emitted from the active layer 220 (i.e., each of the one and other first semiconductor layers is formed of a semiconductor material having a bandgap energy greater than the energy of the light emitted from the active layer 220), and each reflects the light emitted from the active layer 220 by laminating the first pair layers composed of the one and other first semiconductor layers.

Here, since the first reflective layer 260 reflects the light emitted from the active layer 220, a difference in refractive index between the one and other first semiconductor layers is preferably large. Therefore, semiconductor materials composing the one and other first semiconductor layers are used so that the refractive index of the other first semiconductor layer is larger than that of the one first semiconductor layer. The one first semiconductor layer of the first reflective layer 260 is formed of, e.g., AlAs. Meanwhile, the other first semiconductor layer is formed of $Al_xGa_{1-x}As$ ($0.4 \leq X \leq 0.6$) of which Al composition is changed so as to be transparent to the light emitted from the active layer 220. Therefore, the first reflective layer 260 is formed of plural first pair layers in which each first pair layer is a pair of AlAs and $Al_xGa_{1-x}As$.

In other words, in the present embodiment, the composition of the other first semiconductor layer included in the first reflective layer 260 is varied in accordance with a wavelength of the light emitted from the active layer 220. The first reflective layer 260 reflects the light emitted from the active layer 220 by laminating the plural first pair layers which is a lamination of the first pair layers each composed of the one and other first semiconductor layers. Each of the plural first semiconductor layers is transparent to the light emitted from the active layer 220.

It will be explained that, e.g., the one first semiconductor layer is formed of AlAs and the other first semiconductor layer is formed of AlGaAs. In this case, in order to make the plural first semiconductor layers transparent to the light emitted from the active layer 220, the one first semiconductor layer is formed of AlAs and the Al composition of the other first semiconductor layer formed of AlGaAs is varied, thereby forming $Al_xGa_{1-x}As$ which transmits the aforementioned light.

As an example, when a wavelength of the light emitted from the active layer 220 is about 590 nm, the other first semiconductor layer is formed of $Al_{0.6}Ga_{0.4}As$. Meanwhile, when a wavelength of the light emitted from the active layer 220 is about 620 nm, the other first semiconductor layer is formed of $Al_{0.5}Ga_{0.5}As$. In addition, when a wavelength of the light emitted from the active layer 220 is about 640 nm, the other first semiconductor layer can be formed of $Al_{0.4}Ga_{0.6}As$. The refractive index of the other first semiconductor layer decreases with increasing a value of x of $Al_xGa_{1-x}As$ (i.e., an increase of Al composition).

When the wavelength of the light emitted from the active layer 220 is 590 nm, since the refractive index of the other first semiconductor layer is small compared to the case of the wavelength of 640 nm, etc., a difference in the refractive index between one and other first semiconductor layers is decreased compared to the case where the wavelength is longer than 590 nm. In this case, reflectance of the first reflective layer 260 itself is decreased. Therefore, in such a case, it is possible to suppress a decrease in the reflectance of the first reflective layer 260 by increasing the number of pairs of first pair layers so as to be inversely proportional to the decrease in the reflectance.

Second Reflective Layer 262

The second reflective layer 262 is formed by laminating plural second semiconductor layers. In detail, the second reflective layer 262 is formed plural second pair layers composed of one second semiconductor layer and another second semiconductor layer formed of a semiconductor material having refractive index different from that of a semiconductor material composing the one second semiconductor layer. Any one of the one and other second semiconductor layers is formed of a semiconductor material having a bandgap energy equivalent to or smaller than energy of the light emitted from the light emitting layer portion including the active layer 220. In addition, in the present embodiment, it is preferable that there are 5 pairs or less of the second pair layers in the second reflective layer 262. In addition, it is preferable that there are 2 pairs or more of the second pair layers. The number of the second pair layers can be changed in accordance with the number of the first pair layers. For example, it is possible to increase the number of the second pair layers while decreasing the number of the first pair layers. In addition, the second pair layer composing the second reflective layer 262 is formed of a semiconductor material having a bandgap energy greater than that of a semiconductor material composing the semiconductor substrate 10.

Here, when a wavelength $\lambda_{P2}$ is defined not less than 850 nm nor more than 900 nm and refractive index of the one second semiconductor layer is defined as $n_2$, the one first semiconductor layer has a thickness $d_2$ which satisfies a relationship of Thickness $d_2 = \lambda_{P2}/(4 \times n_2) \times x$ ($0.7 \leq x \leq 1.3$). In addition, the other second semiconductor layer has a thickness satisfying the same relationship for the thickness of the one second semiconductor layer. The thickness $d_2$ of the second semiconductor layer is, e.g., not less than 49 nm nor more than 90 nm, preferably, not less than 63 nm nor more than 77 nm. The one second semiconductor layer composing the second reflective layer 262 is formed of a semiconductor material transparent to the light emitted from the active layer 220 and the other second semiconductor layer composing the second reflective layer 262 is formed of a semiconductor material semi-transparent to the light emitted from the active layer 220 (to absorb the aforementioned light). And the light with a wavelength longer than that of the light emitted from the active layer 220 and the aforementioned light is reflected by a lamination of the second pair layers composed of the one and other second semiconductor layers.

Here, "transparent" and "semi-transparent" in the present embodiment will be explained. Firstly, a predetermined semiconductor layer which is "transparent" means that the semiconductor layer is formed of a semiconductor material having a bandgap energy greater than that equivalent to a peak wavelength of light radiated from the light emitting layer portion. Meanwhile, a predetermined semiconductor layer which is "semi-transparent" means that the semiconductor layer is formed of a semiconductor material having a bandgap less than that equivalent to a peak wavelength of light radiated from the light emitting layer portion. In other words, a "semi-transparent" semiconductor layer is formed of a semiconductor material having a bandgap equivalent to a wavelength longer than the peak wavelength, and is a semiconductor layer which partially transmits the light although it is not transparent to the light radiated from the light emitting layer portion.

Since the second reflective layer 262 includes the one second semiconductor layer formed of a material transparent to the light emitted from the active layer 220 and the other second semiconductor layer formed of a material semi-transparent to the aforementioned light, a difference in refractive index between the one and other second semiconductor layers can be increased compared to the case of the first reflective layer 260. The one second semiconductor layer of the second reflective layer 262 is formed of, e.g., AlAs. Meanwhile, the other second semiconductor layer is formed of $Al_xGa_{1-x}As$ ($0.1 \leq X \leq 0.5$) of which Al composition is changed so as to be semi-transparent to the light emitted from the active layer 220. For example, the other second semiconductor layer is formed of $Al_xGa_{1-x}As$ ($0.1 \leq X \leq 0.4$) when a wavelength of the light emitted from the active layer 220 is about 620 nm, and is formed of $Al_xGa_{1-x}As$ ($0.1 \leq X \leq 0.5$) when the wavelength is about 590 nm. Therefore, the second reflective layer 262 is formed of plural second pair layers in which each second pair layer is a pair of AlAs and $Al_xGa_{1-x}As$.

The reason why a semiconductor material semi-transparent to the light emitted from the active layer 220 is used as the other second semiconductor layer is as follows. Namely, it is because, for example, when the light emitted from the active layer 220 is light having a wavelength in a red region, it is possible to increase a difference between a refractive index with respect to red light of the one second semiconductor layer and a refractive index with respect to the other second semiconductor layer by decreasing the Al composition of the AlGaAs which composes the other second semiconductor layer. In addition, although a detail will be described later, radiation light (e.g., infrared light) radiated from the semiconductor substrate 10 (e.g., a GaAs substrate) which is excited by the light emitted from the active layer 220 reaching the semiconductor substrate 10 can be effectively reflected to the semiconductor substrate 10 side by the second reflective layer 262. In addition, the reason why a semiconductor material semi-transparent to the light emitted from the active layer 220 is used as the other second semiconductor layer is to also prevent the light transmitted through the first reflective layer 260 from reaching the buffer layer 200 and the semiconductor substrate 10.

The reason why the other second semiconductor layer is formed of not GaAs but AlGaAs is as follows. Firstly, similarly to the semiconductor substrate 10, it is because, when the other second semiconductor layer is formed of a semiconductor material radiating the radiation light with a wavelength longer than that of the light emitted from the active layer 220 by being excited by the aforementioned light, the radiation light is radiated also from the other second semiconductor layer. In addition, even if the other second semiconductor layer is excited by the light emitted from the active layer 220, it is possible to reduce the radiation light radiated from the other second semiconductor layer by forming the other second semiconductor layer using indirect transition type AlGaAs. Furthermore, since the crystalline quality of AlGaAs is decreased compared to GaAs, even if AlGaAs is excited by the light emitted from the active layer 220, it is not converted into light but into heat.

Front Surface Electrode 100 and Back Surface Electrode 110

The front surface electrode 100 is formed of a material in ohmic contact with the current dispersion layer 250. In detail, the front surface electrode 100 is formed containing at least one metal material for a p-type electrode selected from metal materials such as Be, Zn, Ni, Ti, Pt, Al and Au, etc. For example, the front surface electrode 100 can be formed having a laminated structure in which AuBe, Ni and Au are laminated in this order from the current dispersion layer 250 side. The front surface electrode 100 is provided on a surface of the current dispersion layer 250 opposite to the intermediate layer 240, i.e., a potion of a light extracting surface of the light-emitting element 1. In addition, as an example, the front surface electrode 100 is formed in a substantially circular shape when the light-emitting element 1 is viewed from the top.

The back surface electrode 110 is formed of a material in ohmic contact with the semiconductor substrate 10. In detail, the back surface electrode 110 is formed containing at least one metal material for an n-type electrode selected from metal materials such as Ge, Ni, Ti, Pt, Al and Au, etc. For example, the back surface electrode 110 can be formed having a laminated structure in which AuGe, Ni and Au are laminated in this order from the semiconductor substrate 10 side. The back surface electrode 110 is formed on the substantially entire surface of the back surface of the semiconductor substrate 10.

Manufacturing Method of Light-Emitting Element 1

The light-emitting element 1 in the first embodiment can be formed of, for example, as follows. Firstly, the semiconductor substrate 10 is prepared. Then, a semiconductor laminated structure 20 composed of group III-V compound semiconductor including plural compound semiconductor layers (i.e., the buffer layer 200, the second reflective layer 262, the first reflective layer 260, the n-type cladding layer 210, the active layer 220, the p-type cladding layer 230, the intermediate layer 240 and the current dispersion layer 250) is formed on the semiconductor substrate 10 by, e.g., a Metal Organic Vapor Phase Epitaxy method (MOVPE method). As a result, an epitaxial wafer is manufactured.

By forming the buffer layer 200 on the semiconductor substrate 10, it is possible to cancel influence of dopant used for the previous crystal growth (i.e., influence of furnace memory) which remains in a MOVPE apparatus. As a result, it is possible to stably manufacture the epitaxial wafer. In addition, by epitaxially growing the buffer layer 200 on the semiconductor substrate 10, it is possible to improve the crystalline quality of the compound semiconductor layer which is epitaxially grown on the buffer layer 200.

Next, the front surface electrode 100 is formed on a surface of the epitaxial wafer, i.e., on a portion of the surface of the current dispersion layer 250, by using a photolithography method and a film formation method (e.g., a vacuum deposition method or a sputtering method, etc.). Subsequently, the back surface electrode 110 is formed on the substantially entire surface of the back surface of the semiconductor substrate 10. Furthermore, in order to make ohmic contact between the front surface electrode 100 and the current dispersion layer 250 and between the back surface electrode 110 and the back surface of the semiconductor substrate 10, an alloying process is carried out under a predetermined atmosphere (e.g., under an inert atmosphere such as a nitrogen atmosphere, etc.) at a predetermined temperature for predetermined time.

Then, the epitaxial wafer provided with the front surface electrode 100 and the back surface electrode 110 is dice-cut in accordance with the size of the light-emitting element 1, thereby manufacturing plural light-emitting elements 1. It is possible to remove mechanical damage caused by dicing by applying an etching process to an edge face of the plural light-emitting elements 1 after the dicing process.

The light-emitting element 1 thus manufactured is a light-emitting diode which emits light with an emission wavelength of 630 nm in a red region. Additionally, a shape of the light-emitting element 1 when viewed from the top is substantially rectangular, and a dimension when viewed from the top is 300 μm square.

As a raw material used in the MOVPE method, it is possible to use an organic metallic compound such as trimethylgallium (TMGa), triethylgallium (TEGa), trimethylaluminum (TMAl) or trimethylindium (TMIn), etc., and a hydride gas such as arsine ($AsH_3$) or phosphine ($PH_3$), etc. In addition, disilane ($Si_2H_6$) can be used for a raw material of an n-type dopant. Meanwhile, bis-cyclopentadienyl magnesium ($Cp_2Mg$) can be used for a raw material of a p-type dopant.

Alternatively, hydrogen selenide ($H_2Se$), monosilane ($SiH_4$), diethyl-tellurium (DETe) or dimethyl tellurium (DMTe) can be also used as a raw material of the n-type dopant. In addition, dimethyl zinc (DMZn) or diethyl zinc (DEZn) can be also used as a raw material of the p-type dopant.

Additionally, it is also possible to grow the semiconductor laminated structure 20 on the semiconductor substrate 10 using a Molecular Beam Epitaxy (MBE) method, etc.

Functions of First Reflective Layer 260 and Second Reflective Layer 262

Figure 2:
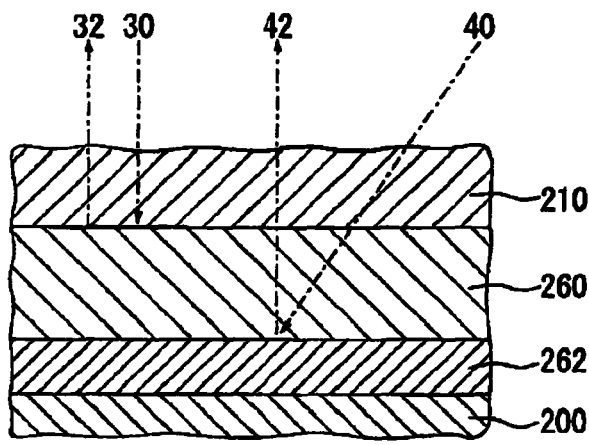
FIG. 2 is an enlarged schematic view of a partial cross section of first and second reflective layers in the first embodiment of the invention.

FIG. 2 is an enlarged schematic view of a partial cross section showing the first reflective layer 260 and the second reflective layer 262 of the light-emitting element 1 in the first embodiment of the invention.

Light 30 radiated by the active layer 220 from the active layer 220 toward the semiconductor substrate 10 side is reflected by the first reflective layer 260 toward the surface of the current dispersion layer 250 which is a light extracting surface (a reflected light 32 of FIG. 2). In detail, among the light 30 radiated from the active layer 220 to the surface side of the semiconductor substrate 10, the light vertically incident to the first reflective layer 260 is reflected on the light extracting surface side by the first reflective layer 260. Here, the light transmitted through the first reflective layer 260, which is light incident to the first reflective layer 260 and fails to be reflected by the first reflective layer 260, is incident to the second reflective layer 262.

By forming the other second semiconductor layer from a material semi-transparent to the light emitted from the active layer 220 (i.e., a material not completely transparent) in the second reflective layer 262, it is possible to increase a difference in a refractive index between the one and other second semiconductor layers, thereby improving the reflectance of the second reflective layer 262. As a result, the light incident to the second reflective layer 262 is reflected by the second reflective layer 262. Furthermore, the light incident to the second reflective layer 262 without being reflected by the second reflective layer 262 is absorbed by the other second semiconductor layer formed to be semi-transparent. As a result, it is suppressed that the light transmitted through the first reflective layer 260 reaches the semiconductor substrate 10. Therefore, since it is possible to reduce the light heading the semiconductor substrate 10 side among the light emitted from the active layer 220 by providing the second reflective layer 262, it is possible to reduce the light which reaches the semiconductor substrate 10. As a result, it is possible to reduce the radiation light generated in the semiconductor substrate 10. It should be noted that, even if the radiation light is radiated from the semiconductor substrate 10 due to the light transmitting through the second reflective layer 262 and reaching the semiconductor substrate 10, the second reflective layer 262 can reflect the radiation light to the semiconductor substrate 10 side again. Thus, by forming the other second semiconductor layer from a material semi-transparent to the light emitted from the active layer 220, it is possible to reduce the number of pairs of second pair layers composing the second reflective layer 262.

In addition, when a portion of the light transmitted through the first reflective layer 260 and the second reflective layer 262 reaches the buffer layer 200 and/or the semiconductor substrate 10, the buffer layer 200 and/or the semiconductor substrate 10 are photoexcited. Then, the buffer layer 200 and/or the semiconductor substrate 10 radiate light (hereinafter referred to as "radiation light") with a wavelength longer than that of the light emitted from the active layer 220. Although the radiation light propagates from the buffer layer 200 and/or the semiconductor substrate 10 toward the current dispersion layer 250 side, as described above, the radiation light is reflected to the buffer layer 200 and/or the semiconductor substrate 10 side by the second reflective layer 262. As a result, radiation of the radiation light from the light extracting surface of the light-emitting element 1 to the outside is suppressed.

In addition, among the light emitted from the active layer 220, light 40 incident from a direction oblique to the first reflective layer 260 will be explained. The light 40 incident from a direction oblique to the first reflective layer 260 transmits through the first reflective layer 260 and propagates in the first reflective layer 260 toward the second reflective layer 262 side. Here, an optical path length of the light 40 in the first reflective layer 260 is long compared to the light vertically incident to the first reflective layer 260. Therefore, in the first reflective layer 260, the light 40 is recognized as light 40 with a wavelength longer than the actual wavelength.

Since the second reflective layer 262 is designed so as to reflect light with a wavelength longer than that of the light reflected by the first reflective layer 260, the light 40 obliquely incident to the first reflective layer 260 is reflected to the light extracting surface side by the second reflective layer 262 (e.g., the reflected light 42 of FIG. 2). For example, it will be explained that the wavelength of the light emitted from the active layer 220 is 620 nm. In this case, when the first reflective layer 260 is designed so as to reflect the light with a wavelength of 620 nm, the light with a wavelength of 620 nm is reflected to the light extracting surface side when vertically incident to the first reflective layer 260. On the other hand, the light obliquely incident (e.g., 45° of incidence angle) to the first reflective layer 260 propagates in the first reflective layer 260. Since the incidence angle is 45°, when a thickness of the first reflective layer 260 is D1, the optical path length of the obliquely incident light in the first reflective layer 260 is a length that D1 is multiplied by square root. As a result, a dummy wavelength of the light incident to the first reflective layer 260 at the incidence angle of 45° is 880 nm.

Here, if the wavelength of the light reflected by the second reflective layer 262 is set to about not less than 850 nm nor more than 900 nm, the light obliquely incident to the first reflective layer 260 is reflected to the light extracting surface side by the second reflective layer 262. Therefore, the second reflective layer 262 in the present embodiment has a function of reflecting the radiation light from the buffer layer 200 and/or the semiconductor substrate 10 excited by the light emitted from the active layer 220 to the semiconductor substrate 10 side as well as reflecting the light obliquely incident to the first reflective layer 260 to the light extracting surface side.

Modification

Although the light-emitting element 1 in the present embodiment emits the light including red light with a wavelength of 630 nm, the wavelength of the light emitted from the light-emitting element 1 is not limited thereto. It is possible to form the light-emitting element 1 emitting the light in a predetermined wavelength range by controlling a structure of the active layer 220 of the semiconductor laminated structure 20. The light emitted from the active layer 220 includes, e.g., light within a wavelength range such as orange light, yellow light or green light, etc.

Furthermore, in the semiconductor substrate 10 and the semiconductor laminated structure 20 provided in the light-emitting element 1, the conductivity type of the semiconductor substrate 10 and the semiconductor laminated structure 20 can be reversed from the present embodiment. For example, the conductivity type of the semiconductor substrate 10, the buffer layer 200, the first reflective layer 260, the second reflective layer 262 and the n-type cladding layer 210 can be replaced with p-type and the conductivity type of the p-type cladding layer 230, the intermediate layer 240 and the current dispersion layer 250 can be replaced with n-type.

Alternatively, the shape of the front surface electrode 100 viewed from the top is not limited to the shape in the present embodiment, and the shape can be square, rhombus or polygon, etc., when viewed from the top. Furthermore, it is possible to add a thin wire electrode or a branch electrode to the front surface electrode 100. In addition, a planar size of the light-emitting element 1 is not limited to the above-mentioned embodiment. For example, it is possible to design the planar size of the light-emitting element 1 so that vertical and horizontal dimensions are each over 1 mm. Additionally, it is possible to appropriately change the vertical and horizontal dimensions depending on the intended use of the light-emitting element 1. As an example, when the planar size of the light-emitting element 1 is designed so that the vertical dimension is shorter than the horizontal dimension, the shape of the light-emitting element 1 viewed from the top is substantially rectangular.

Meanwhile, the active layer 220 can be formed having a quantum well structure. The quantum well structure can be formed from any of a single quantum well structure, a multiple quantum well structure or a strained multiple quantum well structure.

In addition, it is possible to form the active layer 220 so as to have a multiple quantum well structure, and to further form a semiconductor layer or an undoped semiconductor layer as a first insertion layer having a carrier concentration lower than that of the n-type cladding layer 210 between the active layer 220 and the n-type cladding layer 210. Alternatively, it is possible to form the active layer 220 so as to have a multiple quantum well structure, and to further form a semiconductor layer or an undoped semiconductor layer as a second insertion layer having a carrier concentration lower than that of the p-type cladding layer 230 between the active layer 220 and the p-type cladding layer 230. In addition, it is possible to form the active layer 220 so as to have a multiple quantum well structure, and to further form a semiconductor layer or an undoped semiconductor layer having a carrier concentration lower than that of the n-type cladding layer 210 between the active layer 220 and the n-type cladding layer 210, and a semiconductor layer or an undoped semiconductor layer having a carrier concentration lower than that of the p-type cladding layer 230 between the active layer 220 and the p-type cladding layer 230.

Meanwhile, although the first reflective layer 260 is formed of plural first pair layers composed of two layers having a thickness defined by a predetermined relationship, it is possible to adjust balance between the thicknesses of the one and other first semiconductor layers for reflecting light with a desired wavelength. As for the second reflective layer 262, it is possible adjust balance between the thicknesses of the one and other second semiconductor layers for reflecting light with a desired wavelength.

In addition, in the second reflective layer 262, the Al composition ratio of $AlAs/Al_xGa_{1-x}As$ as a second pair layer can be gradually changed. For example, it is possible to change the Al composition continuously or in a stepwise manner so that a value of x gradually decreases from the semiconductor substrate 10 side toward the active layer 220 side. In addition, it is possible to adjust the number of pairs of first pair layers in the first reflective layer 260 and the number of pairs of second pair layers in the second reflective layer 262 in accordance with the emission wavelength of the active layer 220. For example, when the emission wavelength is shorter than the wavelength in the red region, it is possible to increase the number of pairs of first pair layers as well as to decrease that of the second pair layers. This is because, when the emission wavelength becomes shorter than the wavelength in the red region, since luminous efficiency of the active layer 220 decreases, it is effective to improve the reflectance of the first reflective layer 260 by increasing the number of pairs of first pair layers in order to improve the light extraction efficiency of the light-emitting element 1. In addition, since the luminous efficiency decreases, the light heading the semiconductor substrate 10 side is relatively reduced compared to the case of the emission wavelength in the red region, and it is thereby possible to reduce the number of pairs of second pair layers.

Furthermore, it is possible to change the number of pairs of first pair layers in the first reflective layer 260 and the number of pairs of second pair layers in the second reflective layer 262 depending on the current which should be introduced into the light-emitting element 1. For example, the number of pairs of first pair layers in the first reflective layer 260 is increased with increasing the current which should be introduced into the light-emitting element 1. As a result, even when the intensity of the light emitted from the active layer 220 is increased corresponding to the increase in the current, the first reflective layer 260 can appropriately reflect the aforementioned light to the light extracting surface side. It should be noted that, when the number of pairs of first pair layers in the first reflective layer 260 is sufficiently increased in such a case, since the amount of the light reaching the semiconductor substrate 10 side is relatively reduced compared to the case where the number of pairs of first pair layers is small, the number of pairs of second pair layers in the second reflective layer 262 is not necessarily required to be increased. On the other hand, when the number of pairs of first pair layers in the first reflective layer 260 is not increased in such a case, since the amount of the light reaching the semiconductor substrate 10 side is increased, it is preferable that the number of pairs of second pair layers in the second reflective layer 262 is increased.

When the buffer layer 200 is formed of a compound semiconductor having a bandgap energy smaller than energy of the light emitted from the active layer 220, the buffer layer 200 is excited by the light incident to the buffer layer 200. Then, the buffer layer 200 radiates light with a wavelength longer than a wavelength of the aforementioned light. Therefore, in the present embodiment, the intensity of the radiation light radiated from the buffer layer 200 may be decreased by controlling a carrier concentration of the buffer layer 200. For example, the carrier concentration of the buffer layer 200 can be controlled to be a carrier concentration lower than that of the semiconductor substrate 10.

Effect of the First Embodiment

Since the light-emitting element 1 in the present embodiment is provided with the first reflective layer 260 for reflecting the light emitted from the active layer 220 and the second reflective layer 262 between the semiconductor substrate 10 and the first reflective layer 260 for reflecting the radiation light radiated from the semiconductor substrate 10 to the semiconductor substrate 10 side, it is possible to effectively extract the light emitted from the active layer 220 to the outside of the light-emitting element 1 and to reflect the light with a wavelength longer than that of the light emitted from the active layer 220 (light with an unnecessary wavelength) to the semiconductor substrate 10 side. As a result, in the light-emitting element 1, for example, the active layer 220 emits light in a red region and, when the semiconductor substrate 10 is formed of GaAs, it is possible to suppress radiation of the infrared light with a wavelength of about not less than 850 nm nor more than 900 nm radiated from the semiconductor substrate 10 to the outside of the light-emitting element 1. Therefore, the light-emitting element 1 in the present embodiment can be provided as a light-emitting element in which it is possible to suppress malfunction of optical sensors such as a photodiode or as a high-intensity light-emitting element for a scanner.

In other words, in the light-emitting element 1 in the first embodiment, in case that the light with a wavelength in a red region reaches the semiconductor substrate 10 formed of GaAs, even when the light in a wavelength range equivalent to a bandgap of GaAs, i.e., infrared light, is radiated from the semiconductor substrate 10 as radiation light, the radiation light is reflected to the semiconductor substrate 10 side again by the second reflective layer 262. In addition, in the light-emitting element 1, none of the first reflective layer 260 and the second reflective layer 262 contains GaAs. Therefore, even when the light emitted from the active layer 220 is incident to the first reflective layer 260 and the second reflective layer 262, the light in the wavelength range equivalent to the bandgap of GaAs is not radiated from the first reflective layer 260 and the second reflective layer 262. As a result, according to the light-emitting element 1 in the present embodiment, it is possible to suppress the radiation of the radiation light to the outside.

In addition, in the light-emitting element 1 in the first embodiment, the light with a wavelength longer than that of the light reflected by the first reflective layer 260 is reflected by the second reflective layer 262. Therefore, the light obliquely incident to the first reflective layer 260 is reflected to the light extracting surface side by the second reflective layer 262. As a result, according to the light-emitting element 1 in the present embodiment, it is possible to improve optical output of the light-emitting element 1.

In addition, in the light-emitting element 1 in the present embodiment, since the second reflective layer 262 is composed of the one second semiconductor layer transparent to the light emitted from the active layer 220 and the other second semiconductor layer semi-transparent to the aforementioned light, it is possible to improve the reflectance of the second reflective layer 262 itself, thereby reducing the number of pairs of second pair layers. As a result, it is possible to manufacture the light-emitting element 1 in the first embodiment at low cost. Furthermore, in the light-emitting element 1, by forming the other second semiconductor layer of the second reflective layer 262 from a material semi-transparent to the light emitted from the active layer 220, the reflectance with respect to the radiation light radiated from the semiconductor substrate 10 can be increased to a level that the radiation light does not reach the light extracting surface side without increasing the number of pairs of second pair layers. As a result, it is possible to reduce materials and manufacturing time, thereby reducing the manufacturing cost.

Second Embodiment

FIG. 3 is a schematic longitudinal section showing a light-emitting element in a second embodiment of the invention.

A light-emitting element 2 in the second embodiment has the same structure as the light-emitting element 1 in the first embodiment, except that the active layer 220 is sandwiched by a first undoped layer 270 and a second undoped layer 272. Therefore, a detailed explanation will be omitted except for differences.

The light-emitting element 2 in the second embodiment includes a semiconductor substrate 10, a buffer layer 200 formed on the semiconductor substrate 10, a second reflective layer 262 formed on the buffer layer 200, a first reflective layer 260 formed on the second reflective layer 262, an n-type cladding layer 210 formed on the first reflective layer 260, a second undoped layer 272 formed on the n-type cladding layer 210, an active layer 220 formed on the second undoped layer 272, a first undoped layer 270 formed on the active layer 220, a p-type cladding layer 230 formed on the first undoped layer 270, an intermediate layer 240 formed on the p-type cladding layer 230, and a current dispersion layer 250 formed on the intermediate layer 240. In the second embodiment, a semiconductor laminated structure 22 is formed in which the first undoped layer 270 and the second undoped layer 272 are inserted into the semiconductor laminated structure 20 of the first embodiment.

The first undoped layer 270 suppresses diffusion of p-type dopant contained in the p-type cladding layer 230 into the active layer 220. Meanwhile, the second undoped layer 272 suppresses diffusion of n-type dopant contained in the n-type cladding layer 210 into the active layer 220. The first undoped layer 270 and the second undoped layer 272 are formed of, e.g., $(Al_xGa_{1-x})_YIn_{1-Y}P$. Since the diffusion of dopant from the p-type cladding layer 230 and the n-type cladding layer 210 into the active layer 220 can be suppressed by sandwiching the active layer 220 between the first undoped layer 270 and the second undoped layer 272, it is possibly to improve reliability of the light-emitting element 2.

Although the light-emitting element 2 in the second embodiment has a structure in which the active layer 220 is sandwiched by the first undoped layer 270 and the second undoped layer 272, in the modification of the second embodiment, it is possible to form a light-emitting element in which either the first undoped layer 270 or the second undoped layer 272 is not formed.

Third Embodiment

FIG. 4 is a schematic longitudinal section showing a light-emitting element in a third embodiment of the invention.

A light-emitting element 3 in the third embodiment has the same structure as the light-emitting element 1 in the first embodiment, except that the buffer layer 200 is not provided. Therefore, a detailed explanation will be omitted except for differences.

Unlike the light-emitting element 1 in the first embodiment, the light-emitting element 3 in the third embodiment is not provided with the buffer layer 200. In other words, the light-emitting element 3 is configured so that the a semiconductor laminated structure 24, in which the buffer layer 200 is removed from the semiconductor laminated structure 20 of the first embodiment, is formed on the semiconductor substrate 10. Therefore, a portion of the light 30 transmitted through the first reflective layer 260 without being reflected by the first reflective layer 260 reaches the semiconductor substrate 10. Then, the semiconductor substrate 10 is excited by the light reached the semiconductor substrate 10, and radiates the radiation light with a wavelength longer than that of the light emitted from the active layer 220. Although the radiation light propagates from the semiconductor substrate 10 toward the current dispersion layer 250 side, it is reflected to the semiconductor substrate 10 side by the second reflective layer 262.

Example 1

In Example 1, a light-emitting element, which is provided with a structure shown in FIG. 1 in the same manner as the light-emitting element 1 in the first embodiment of the invention and also has following structure, was manufactured by the MOVPE method. The manufactured light-emitting element in Example 1 is a light emitting diode (LED) which emits orange light with a wavelength of around 620 nm.

In other words, the light-emitting element in Example 1 is a LED having a tip shape of 300 μm square when viewed from the top. In detail, the light-emitting element in Example 1 includes, an n-type GaAs buffer layer, an n-type second reflective layer, an n-type first reflective layer, an n-type $(Al_{0.7}Ga_{0.3})_{0.5}In_{0.5}P$ cladding layer, an undoped $Ga_{0.5}In_{0.5}P$ active layer, a p-type $(Al_{0.7}Ga_{0.3})_{0.5}In_{0.5}P$ cladding layer, a p-type $Ga_{0.6}In_{0.4}P$ intermediate layer and a p-type GaP current dispersion layer on an n-type GaAs substrate in this order.

In addition, in Example 1, the n-type first reflective layer had a structure in which 10 pairs (i.e., 20 layers in 10 pairs) of the first pair layers composed of n-type AlAs (film thickness: about 50 nm) and n-type $Al_{0.5}Ga_{0.5}As$ (film thickness: about 45 nm) are laminated. Meanwhile, the n-type second reflective layer had a structure in which 2 pairs (i.e., 4 layers in 2 pairs) of the second pair layers composed of n-type transparent AlAs (film thickness: about 70 nm) and n-type semi-transparent $Al_{0.25}Ga_{0.75}As$ (film thickness: about 60 nm) are laminated.

In addition, a front surface electrode (i.e., a p-type electrode) had a structure in which AuBe/Ni/Au are laminated from the current dispersion layer side in this order, and was formed in a substantially circular shape having a diameter of 120 μm. AuBe was 50 nm thick, Ni was 60 nm thick and Au was 1000 nm thick. Meanwhile, a back surface electrode (i.e., an n-type electrode) had a structure in which AuGe/Ni/Au are laminated on the back surface side of the semiconductor substrate 10 in this order, and was formed on the entire back surface. AuGe was 50 nm thick, Ni was 60 nm thick and Au was 300 nm thick. An alloying process for alloying the front and back surface electrodes was carried out in a nitrogen atmosphere at 400° C. for 5 minutes.

A light-emitting element in Example 1 having such a structure was die-bonded to a predetermined stem, and the front surface electrode was subsequently wire-bonded to a predetermined connection region of the stem, thereby manufacturing the light-emitting element for evaluation.

Comparative Examples

A light-emitting element in Comparative Example has the same structure as the light-emitting element in the Example 1, except that a second reflective layer is not provided. Therefore, a detailed explanation will be omitted except for differences.

In Comparative Example, two types of light-emitting elements, one of which is a light-emitting element in which the number of first pair layers in the first reflective layer is 10 pairs (the light-emitting element in Comparative Example 1) and another is a light-emitting element in which the number of first pair layers in the first reflective layer is 12 pairs (the light-emitting element in Comparative Example 2), were manufactured. The reason why two types of light-emitting elements having the varied number of pairs of first pair layers were manufactured as described above is to confirm variation of the intensity of the radiation light from a GaAs substrate due to an increase in the number of pairs of first pair layers.

Comparison Between Example 1 and Comparative Example 1

A ratio of Radiation Peak Intensity to Emission Peak Intensity

As a result of measuring emission spectrum of the light-emitting element in Example 1 at the electric current of 20 mA, a strong emission peak was observed in the vicinity of 620 nm (hereinafter referred to as "emission peak") and a faint emission peak was observed in the vicinity of 875 nm (hereinafter referred to as "radiation peak"). The emission peak is a peak based on the light emitted from the active layer and the radiation peak is a peak based on the radiation light from the buffer layer and the GaAs substrate. At the time of measurement, a ratio of the radiation peak intensity to the emission peak intensity (radiation peak intensity/emission peak intensity×100) was 0.31%. This shows that it is possible to suppress about 50% of radiation light (infrared light) from the GaAs substrate compared to the below-described light-emitting elements in Comparative Examples 1 and 2.

In addition, as a result of measuring emission spectrum of the light-emitting element in Example 1 at the electric current of 60 mA, a ratio of the radiation peak intensity to the emission peak intensity (radiation peak intensity/emission peak intensity×100) was 0.50%. As a result, it was shown that, similarly to the case of small electric current (e.g., electric current of 20 mA), it is possible to suppress radiation light (infrared light) from the GaAs substrate even in the case of increasing the electric current. It should be noted that a ratio of the radiation peak intensity to the emission peak intensity (radiation peak intensity/emission peak intensity×100) at the electric current of 20 mA is preferably 0.5% or less, more preferably, 0.4% or less. In addition, a ratio of the radiation peak intensity to the emission peak intensity (radiation peak intensity/emission peak intensity×100) at the electric current of 60 mA is preferably 0.8% or less, more preferably, 0.6% or less.

On the other hand, as a result of measuring emission spectrum of the light-emitting elements in Comparative Examples 1 and 2 at the electric current of 20 mA, a strong emission peaks in the vicinity of 620 nm and a radiation peak in the vicinity of 875 nm were each observed.

As a result of measuring emission spectrum of the light-emitting element in Comparative Example 1 at the electric current of 20 mA, a ratio of the radiation peak intensity to the emission peak intensity (radiation peak intensity/emission peak intensity×100) was 058%. Meanwhile, the light-emitting element in Comparative Example 2, the ratio thereof was 0.54%. In the light-emitting elements in Comparative Examples 1 and 2, ratios of the radiation peak intensity to the emission peak intensity were each over 0.5%. In addition, as understood from the results of Comparative Examples 1 and 2, it was confirmed that the effect of reducing the radiation light is small only by increasing the number of pairs of first pair layers in the first reflective layer. As a result of measuring emission spectrum of the light-emitting element in Comparative Example 1 at the electric current of 60 mA, a ratio of the radiation peak intensity to the emission peak intensity was 087%, and the ratio in Comparative Example 2 was 0.80%, which is very high value.

Comparison between Example 1 and Comparative Example 1

Light Emission Output

The light emission output of the light-emitting element in Example 1 at the electric current of 20 mA was 1.70 mW. On the other hand, the light emission output of the light-emitting element in Comparative Example 1 (the light-emitting element having only 10 pairs of first reflective layers) at the electric current of 20 mA was 1.638 mW. When comparing Example 1 with Comparative Example 1, the optical output of the light-emitting element in Example 1 is increased about 4%. Meanwhile, the light emission output of the light-emitting element in Comparative Example 2 (the light-emitting element having only 12 pairs of first reflective layers) at the electric current of 20 mA was 1.711 mW. When comparing Example 1 with Comparative Example 2, the optical output of the light-emitting element in Example 1 was in the same level as the light-emitting element in Comparative Example 2.

From the above comparison, it was confirmed that, when the number of pairs of first reflective layers of the light-emitting element in Comparative Example 2 is the same as sum of the number of pairs of first pair layers in the first reflective layer element and the number of pairs of second pair layers in the second reflective layer of the light-emitting in Example 1, although the light emission output of the light-emitting element in Example 1 is in the same level as that of the light-emitting element in Comparative Example 2, the radiation light from the GaAs substrate can be reduced in Example 1. As a result, in Example, it was shown that, even when the number of pairs of first pair layers in the reflective layer is less than that in Comparative Example 2, it is possible to improve the light emission output due to a presence of the second reflective layer. As described in the above explanation for FIG. 2, it is an effect resulting from that the light obliquely incident to the first reflective layer can be reflected to the light extracting surface side by the second reflective layer.

As described above, in Comparative Examples 1 and 2, the intensity of the radiation light radiated from the GaAs substrate to the outside of the light-emitting element was high. In addition, even when the number of pairs of first pair layers in the first reflective layer is simply increased in the same manner as Comparative Examples 2, although the light emission output itself is improved, the effect of reducing the radiation light was very small.

Figure 5:
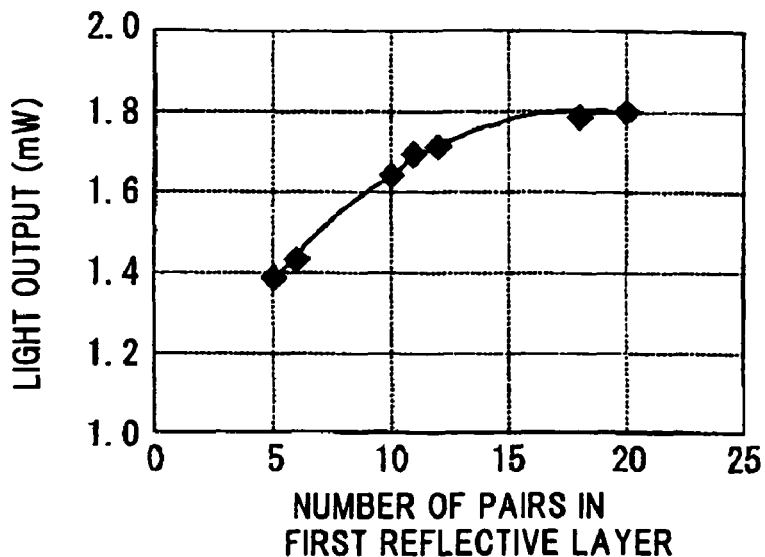
FIG. 5 is a view showing a relation between the number of pairs of first pair layers in the first reflective layer and light emission output in a light-emitting element in Comparative Example.

FIG. 5 is a view showing a relation between the number of pair of first pair layers in the first reflective layer (hereinafter referred to as "the first reflective layer pair number") and light emission output in a light-emitting element in Comparative Example.

As understood by referring to FIG. 5, in the light-emitting element in Comparative Example, when the first reflective layer pair number is 20 pairs, the increase in the light emission output showed a tendency of saturation. Therefore, in Comparative Examples 1 and 2, even if the number of pairs of first pair layers is further increased, in view of an increase in manufacturing cost or an increase in forward voltage, etc., it was shown that there is a limit in the increase of the light emission output.

Example 1

Difference in Refractive Index

In the second reflective layer of the light-emitting element in Examples 1, the one second semiconductor layer (AlAs) is a transparent layer and the other second semiconductor layer ($Al_{0.25}Ga_{0.75}As$) is a semi-transparent layer. The difference in the refractive index between the one second semiconductor layer (AlAs) and the other second semiconductor layer ($Al_{0.25}Ga_{0.75}As$) is 0.605. On the other hand, in the first reflective layer, the difference in the refractive index between the one first semiconductor layer (AlAs) and the other first semiconductor layer ($Al_{0.25}Ga_{0.75}As$) is 0.380. Therefore, in Examples 1, since the refractive index difference in the second reflective layer is larger than that in the first reflective layer, the reflection efficiency in the second reflective layer is higher than that in the first reflective layer. It is considered that, as a result, the light emission output of the light-emitting element in Examples 1 is higher than that of the light-emitting element in Comparative Examples 1.

Examples 1

Reliability

Furthermore, forward operating voltage of the light-emitting element in Examples 1 was 1.94V at the electric current of 20 mA. In addition, a reliability test of the light-emitting element in Examples 1 was conducted as follows. In other words, when the light emission output after 168 hours of electrification under a condition at a room temperature at electric current of 50 mA (post-electrification light emission output) was compared with the light emission output before the electrification (pre-electrification light emission output), the pre-electrification light emission output and the post-electrification light emission output were the same. In sum, relative output (the post-electrification light emission output/pre-electrification light emission output×100) was 100%.

As described above, it was shown that the light-emitting element in Examples 1 emits light at the same light emission output and the same forward voltage as Comparative Example 2 and has high reliability, and it is possible to reduce the radiation light from the GaAs substrate.

Figure 6A:
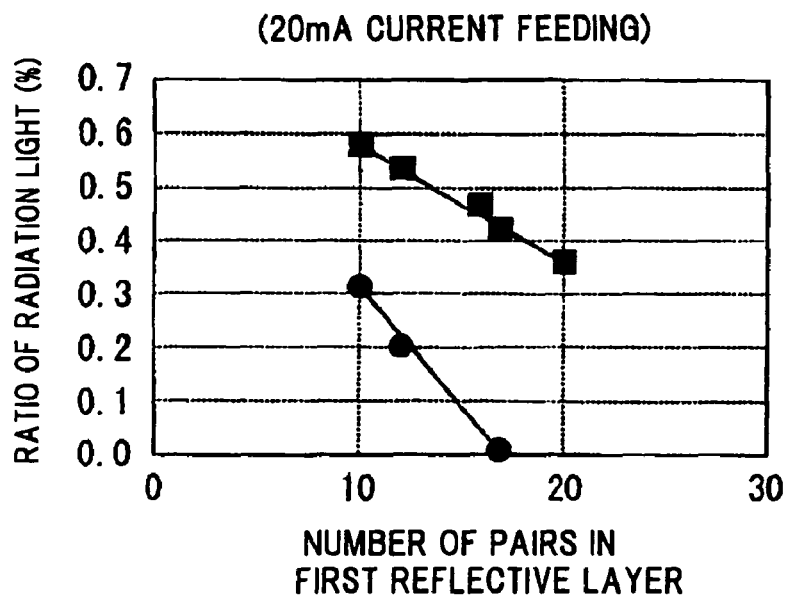
FIG. 6A is a view showing a relation between the number of pair of first pairs layers in the first reflective layer at the electric current of 20 mA and a ratio of radiation peak intensity to emission peak intensity in light-emitting elements in Example 1 and Comparative Example.
Figure 6B:
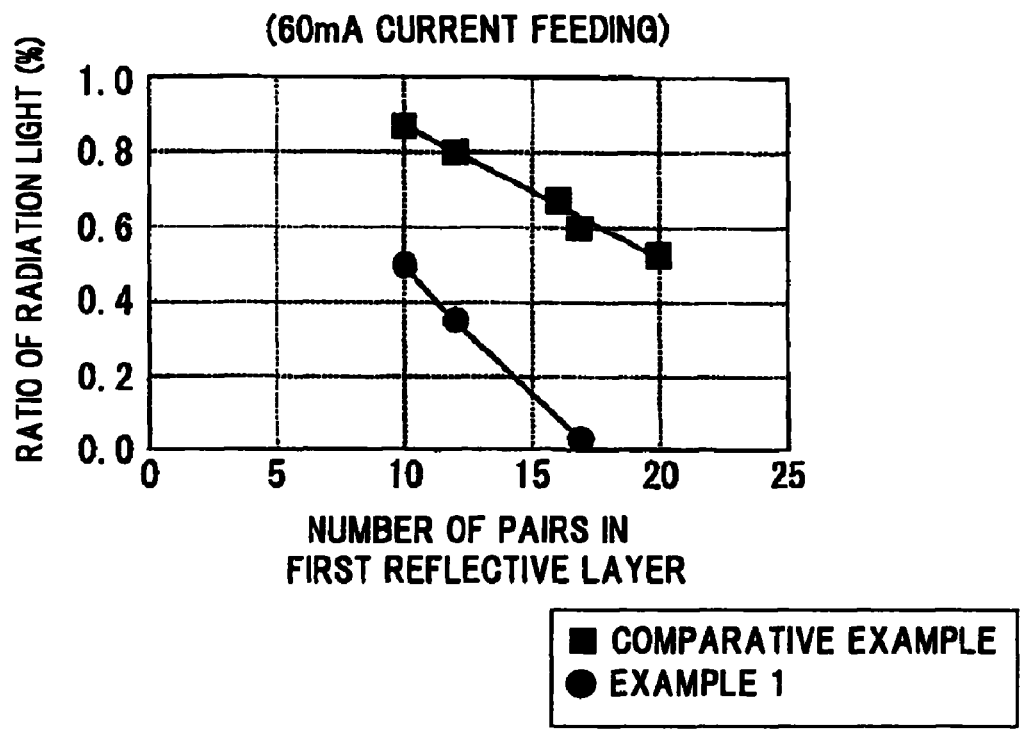
FIG. 6B is a view showing a relation between the number of pairs of first pair layers in the first reflective layer at the electric current of 60 mA and a ratio of radiation peak intensity to emission peak intensity in light-emitting elements in Example 1 and Comparative Example.

FIGS. 6A and 6B are views showing a relation between the number of pair of first pair layers in the first reflective layer (hereinafter referred to as "the first reflective layer pair number") and a ratio of radiation peak intensity to emission peak intensity (radiation peak intensity/emission peak intensity× 100, hereinafter referred to as "the radiation ratio") in light-emitting elements of Example 1 and Comparative Example. In detail, FIG. 6A shows a relation at the electric current of 20 mA and FIG. 6B shows a relation at the electric current of 60 mA.

Referring to FIGS. 6A and 6B, in Example 1, it is understood that the radiation ratio can be reduced to substantially 0% before the first reflective layer pair number reaches 20 in accordance with increasing the number of pairs of first pair layers in the first reflective layer either at the electric current of 20 mA or 60 mA. On the other hand, in Comparative Example, even when the first reflective layer pair number was 20 pairs, it was not possible to achieve 0% of the radiation ratio. Therefore, effect of reducing the radiation light by providing not only the first reflective layer but also providing the second reflective layer in the same manner as Example 1 was clearly shown.

Example 2

In Example 1, a light-emitting element, which is provided with a structure shown in FIG. 3 in the same manner as the light-emitting element 2 in the second embodiment of the invention and also has following structure, was manufactured by the MOVPE method. A light-emitting element in Example 2 has the same structure as the light-emitting element in Example 1, except that the active layer is sandwiched by two undoped layers. Therefore, a detailed explanation will be omitted except for differences.

The light-emitting element in Example 2 has a structure in which a 100 nm thick undoped $(Al_{0.7}Ga_{0.3})_{0.5}In_{0.5}P$ is each inserted between an n-type $(Al_{0.7}Ga_{0.3})_{0.5}In_{0.5}P$ cladding layer and an undoped $Ga_{0.5}In_{0.5}P$ active layer and between the undoped $Ga_{0.5}In_{0.5}P$ active layer and a p-type $(Al_{0.7}Ga_{0.3})_{0.5}In_{0.5}P$ cladding layer.

As a result of measuring emission spectrum of the light-emitting element in Example 2 at the electric current of 20 mA, a strong emission peak was observed in the vicinity of 620 nm and a faint radiation peak was observed in the vicinity of 875 nm. At the time of measurement, a ratio of the radiation peak intensity to the emission peak intensity (radiation peak intensity/emission peak intensity×100) was 0.32%. This shows that it is possible to suppress about 50% of radiation light (infrared light) from the GaAs substrate compared to the light-emitting elements in Comparative Examples 1 and 2.

In addition, as a result of measuring emission spectrum of the light-emitting element in Example 2 at the electric current of 60 mA, a ratio of the radiation peak intensity to the emission peak intensity (radiation peak intensity/emission peak intensity×100) was 0.51%. As a result, it was shown that, similarly to the case of small electric current (e.g., electric current of 20 mA), it is possible to suppress radiation (infrared light) light from the GaAs substrate even in the case of increasing the electric current.

In addition, the light emission output of the light-emitting element in Example 2 at the electric current of 20 mA was 1.81 mW. This shows that the output is increased about 6% compared to the light-emitting element in Example 1. The reason why the optical output is increased in Example 2 is caused by that diffusion of dopant into the active layer is suppressed by sandwiching the active layer between undoped $(Al_{0.7}Ga_{0.3})_{0.5}In_{0.5}P$ layers. However, the forward voltage of the light-emitting element in Example 2 was 1.96V, which is higher than Example 1. Therefore, in order to optimize the film thickness of the undoped layer, a relation between the film thickness of the undoped $(Al_{0.7}Ga_{0.3})_{0.5}In_{0.5}P$ layer and the forward voltage was examined.

Figure 7:
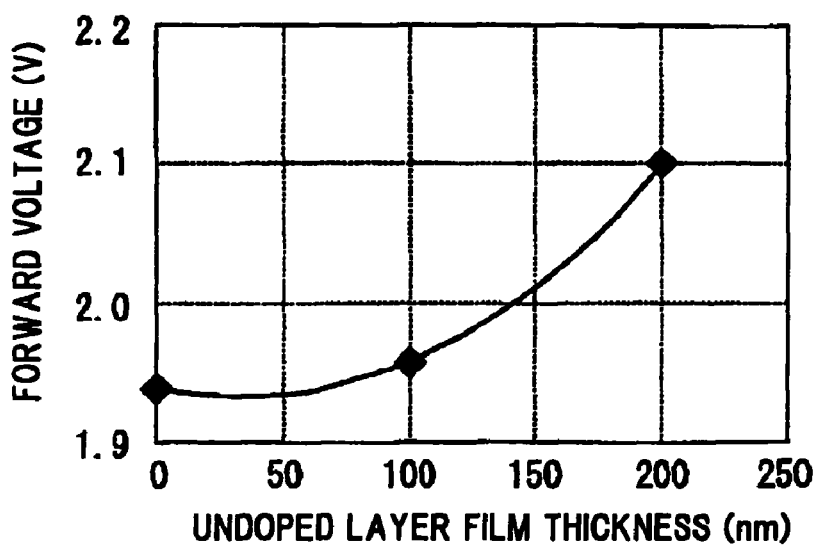
FIG. 7 is a view showing a relation between a film thickness of an undoped $(Al_{0.7}Ga_{0.3})_{0.5}In_{0.5}P$ layer and forward voltage of the light-emitting element.

FIG. 7 is a view showing a relation between a film thickness of an undoped $(Al_{0.7}Ga_{0.3})_{0.5}In_{0.5}P$ layer and forward voltage of the light-emitting element in Example 2.

Table 1 shows a relation between a film thickness of the undoped $(Al_{0.7}Ga_{0.3})_{0.5}In_{0.5}P$ layer and the forward voltage of the light-emitting element in Example 2.

TABLE 1

| Thickness of undoped $(Al_{0.7}Ga_{0.3})_{0.5}In_{0.5}P$ layer (nm) | Forward voltage (V) |
| --- | --- |
| 0 | 1.94 |
| 100 | 1.96 |
| 200 | 2.10 |

Referring to FIG. 7 and Table 1, the film thickness of the undoped $(Al_{0.7}Ga_{0.3})_{0.5}In_{0.5}P$ layer is preferably 200 nm or less, more preferably, not less than 50 nm and more than 100 nm. In other words, the sum of the film thicknesses of the undoped $(Al_{0.7}Ga_{0.3})_{0.5}In_{0.5}P$ layers which sandwich the active layer is preferably 400 nm or less, more preferably, not less than 100 nm nor more than 200 nm.

Although the embodiments of the invention has been described, the invention according to claims is not to be limited to the above-mentioned embodiments and examples. Further, please note that not all combinations of the features described in the embodiments and examples are not necessary to solve the problem of the invention.

What is claimed is:

1. A light-emitting element, comprising:
   a semiconductor substrate;
   a light emitting layer portion comprising an active layer on the semiconductor substrate;
   a first reflective layer between the semiconductor substrate and the active layer for reflecting light emitted from the active layer; and
   a second reflective layer between the semiconductor substrate and the first reflective layer for reflecting light with a wavelength different from that of the light reflected by the first reflective layer,
   wherein the first reflective layer comprises a plurality of first pair layers, each of the first pair layers comprising two first semiconductor layers having refractive indexes different from each other,
   wherein the two first semiconductor layers have a bandgap energy greater than an energy of the light emitted from the active layer,
   wherein the second reflective layer comprises a plurality of second pair layers, each of the second pair layers comprising two second semiconductor layers having refractive indexes different from each other, and
   wherein the two second semiconductor layers have a bandgap energy equivalent to or smaller than the energy of the light emitted from the active layer.

2. The light-emitting element according to claim 1, wherein the second reflective layer reflects light with a wavelength longer than that of the light reflected by the first reflective layer.

3. The light-emitting element according to claim 2, wherein the light emitting layer portion comprises a first cladding layer of a first conductivity type, a second cladding layer of a second conductivity type different from the first conductivity type, and the active layer between the first and second cladding layers, wherein the light-emitting element further comprises a current dispersion layer of the second conductivity type on the second cladding layer opposite the active layer via an intermediate layer, and wherein the intermediate layer comprises a semiconductor comprising a bandgap energy between that of the second cladding layer and that of the current dispersion layer.

4. The light-emitting element according to claim 1, wherein the two first semiconductor layers of the first reflective layer and the two second semiconductor layers of the second reflective layer each have a bandgap energy greater than that of the semiconductor substrate.

5. The light-emitting element according to claim 4, wherein the two first semiconductor layers of the first reflective layer each have a thickness $d_1$ to satisfy $d_1 = \lambda_{P1}/(4 \times n_1) \times X$ ($0.7 \leq X \leq 1.3$), where a peak wavelength of the light emitted from the active layer is $\lambda_{P1}$ and a refractive index of the two first semiconductor layers is $n_1$.

6. The light-emitting element according to claim 5, the two second semiconductor layers of the second reflective layer each have a thickness $d_2$ to satisfy $d_2 = \lambda_2/(4 \times n_2) \times X$ ($0.7 \leq X \leq 1.3$), where a wavelength $\lambda_{P2}$ is in a range of not less than 850 nm and not more than 900 nm and a refractive index of the two second semiconductor layers is $n_2$.

7. The light-emitting element according to claim 6, wherein the first reflective layer comprises not less than 10 pairs and not more than 20 pairs of the first pair layers, and the second reflective layer comprises not less than 2 pairs and not more than 5 pairs of the second pair layers.

8. The light-emitting element according to claim 7, wherein when the light emitted from the active layer is inputted to the semiconductor substrate, the semiconductor substrate emits light with a wavelength longer than that of the inputted light.

9. The light-emitting element according to claim 8, further comprising:
a buffer layer between the semiconductor substrate and the second reflective layer,
wherein the buffer layer has a carrier concentration lower than that of the semiconductor substrate.

10. The light-emitting element according to claim 9, wherein the active layer comprises a multiple quantum well structure, and
wherein the light-emitting element further comprises:
a first insertion layer between the active layer and the first cladding layer, the first insertion layer having a carrier concentration lower than that of the first cladding layer; and
a second insertion layer between the active layer and the second cladding layer, the second insertion layer having a carrier concentration lower than that of the second cladding layer.

11. The light-emitting element according to claim 1, wherein the second reflective layer has a greater difference in a refractive index between one and an other one of the second semiconductor layers than a refractive index between one and an other one of the first semiconductor layers of the first reflective layer.

12. The light-emitting element according to claim 1, wherein a difference between the refractive indexes of the two first semiconductor layers is greater than a difference between the refractive indexes of the two second semiconductor layers.

13. The light-emitting element according to claim 1, wherein the two first semiconductor layers have different composition ratios.

14. The light-emitting element according to claim 1, wherein the two first semiconductor layers have different thicknesses.

15. The light-emitting element according to claim 1, wherein the bandgap energy of the two second semiconductor layers is equivalent to or smaller than an energy of a peak wavelength of light radiated from the light emitting layer portion.

16. The light-emitting element according to claim 1, wherein one of the two second semiconductor layers comprises a material transparent to the light emitted from the active layer, and an other one of the two second semiconductor layers comprises a material semi-transparent to the light emitted from the active layer.

17. The light-emitting element according to claim 1, wherein an Al ratio in the second reflective layer decreases from a side of the semiconductor substrate toward a side of the active layer.

18. The light-emitting element according to claim 1, wherein an Al ratio in the second reflective layer continuously changes from a side of the semiconductor substrate toward a side of the active layer.

19. The light-emitting element according to claim 1, wherein an Al ratio in the second reflective layer changes in a stepwise manner from a side of the semiconductor substrate toward a side of the active layer.

* * * * *